United States Patent
Sumi et al.

(10) Patent No.: US 7,135,224 B2
(45) Date of Patent: Nov. 14, 2006

(54) ADHESIVE TAPE

(75) Inventors: Takaji Sumi, Tokyo (JP); Osamu Yamazaki, Saitama (JP); Takashi Sugino, Kawaguchi (JP); Hideo Senoo, Kawaguchi (JP)

(73) Assignee: Lintec Corporation, Tokyo (JP)

( * ) Notice: Subject to any disclaimer, the term of this patent is extended or adjusted under 35 U.S.C. 154(b) by 346 days.

(21) Appl. No.: 10/487,531

(22) PCT Filed: Aug. 8, 2002

(86) PCT No.: PCT/JP02/08127

§ 371 (c)(1),
(2), (4) Date: Feb. 23, 2004

(87) PCT Pub. No.: WO03/017363

PCT Pub. Date: Feb. 27, 2003

(65) Prior Publication Data

US 2004/0232563 A1    Nov. 25, 2004

(30) Foreign Application Priority Data

Aug. 21, 2001   (JP) .............................. 2001-250134

(51) Int. Cl.
*B32B 27/38* (2006.01)

(52) U.S. Cl. .......................... 428/355 EP; 428/355 R; 428/355 AC; 428/413

(58) Field of Classification Search .................... None
See application file for complete search history.

(56) References Cited

U.S. PATENT DOCUMENTS

| | | | |
|---|---|---|---|
| 4,612,209 A * | 9/1986 | Forgo et al. ................. | 427/516 |
| 5,110,388 A | 5/1992 | Komiyama et al. | |
| 6,303,219 B1 | 10/2001 | Sawamura et al. | |
| 6,727,334 B1 | 4/2004 | Nishiwaki et al. | |

FOREIGN PATENT DOCUMENTS

| | | |
|---|---|---|
| DE | 2200021 A | 7/1973 |
| JP | 55-145726 A | 11/1980 |
| JP | 60-196956 A | 10/1985 |
| JP | 60-223139 A | 11/1985 |
| JP | 02-032181 A | 2/1990 |
| WO | WO 00/47666 A1 | 8/2000 |

OTHER PUBLICATIONS

Abstract of JP 08-053655, provided by the JPO website.*

* cited by examiner

*Primary Examiner*—Michael J. Feely
(74) *Attorney, Agent, or Firm*—The Webb Law Firm

(57) ABSTRACT

An adhesive tape comprising a base and, superimposed thereon, an adhesive layer, this adhesive layer comprising an adherent component (A), an epoxy resin (B), a thermally active latent epoxy resin curing agent (C), an energy radiation polymerizable compound (D) and a photopolymerization initiator (E), wherein either or both of the epoxy resin (B) and energy radiation polymerizable compound (D) have a dicyclopentadiene skeleton in its molecule or molecules thereof. The resultant adhesive tape has an adhesive layer which provides reduced water absorption of an adhesive curing product and which enables a lowering of the elastic modulus thereof during thermocompression bonding.

2 Claims, No Drawings

ADHESIVE TAPE

FIELD OF THE INVENTION

The present invention relates to a novel pressure sensitive adhesive tape. More particularly, the present invention relates to a pressure sensitive adhesive tape which is especially suitable for use in the process of dicing a silicon wafer or the like and performing die bonding of chips obtained by the dicing to a lead frame.

BACKGROUND OF THE INVENTION

A semiconductor wafer of, for example, silicon or gallium arsenide is produced in the form of a large diameter. This wafer is cut and separated (diced) into small element chips (IC chips) and is transferred to the subsequent mounting step. In this process, in particular, the semiconductor wafer in the state of being stuck to a pressure sensitive adhesive tape is subjected to dicing, cleaning, drying, expanding and pickup steps, and is transferred to the subsequent bonding step.

It is desired that the above pressure sensitive adhesive tape employed from the semiconductor wafer dicing step through the pickup step have an adhesive strength which is so large as to securely hold the wafer chips in the dicing to drying steps but which is on such a level that no adhesive adheres to the wafer chips in the pickup step.

The chips having been picked up are bonded to lead frames with the use of a die bonding adhesive, such as an epoxy adhesive, in the die bonding step. Thus, semiconductor devices are produced. However, when IC chips are extremely small, application of an appropriate amount of adhesive is difficult, and there has occurred such a problem that the adhesive overflows IC chips. On the other hand, when IC chips are large, there has occurred such a problem that the bonding with satisfactory strength cannot be attained because of, for example, an insufficient amount of adhesive. Further, the application of such a die bonding adhesive is laborious. Therefore, there is a demand for an improvement enabling simplification of the process.

For solving the above problems, various pressure sensitive adhesive tapes for wafer sticking which can perform both a wafer fixing function and a die bonding function have been proposed (see, for example, Japanese Patent Laid-open Publication No. 2 (1990)-32181).

Japanese Patent Laid-open Publication No. 2 (1990)-32181 discloses a pressure sensitive adhesive tape comprising a base and, superimposed thereon, an adhesive layer constituted of a composition which is composed of a (meth) acrylic acid ester copolymer, a general-purpose epoxy resin, a general-purpose photopolymerizable low-molecular compound, a thermally active latent epoxy resin curing agent and a photopolymerization initiator. This adhesive layer performs a wafer fixing function at the time of wafer dicing. After the completion of dicing, when exposed to energy radiation, the adhesive layer is cured with the result that the adhesive strength between the adhesive layer and the base is lowered. Thus, upon picking up of IC chips, the pressure sensitive adhesive layer is detached together with the IC chips from the base. The IC chips with the pressure sensitive adhesive layer are mounted on lead frames and heated. Consequently, the epoxy resin contained in the adhesive layer exerts a bonding strength to thereby finalize bonding of the IC chips to lead frames.

The adhesive tape for wafer sticking disclosed in the above publication enables so-called direct die bonding and enables omitting the step of applying a die bonding adhesive. That is, in the adhesive layer of the adhesive tape, all the components are cured upon the die bonding carried out through the energy radiation curing and thermal curing, so that the chips and lead frames are bonded to each other with extremely large strength.

Thereafter, generally, wire bonding is conducted via the reflow step.

For use in the reflow step, in recent years, solders not containing lead have been developed in order to cope with environmental problems. The melting temperature of the solders not containing lead is higher than that of conventional solder containing lead, thereby rendering high reflow temperatures inevitable. However, when the reflow temperature is high, even a small amount of water contained in the adhesive layer would vaporize and inflate, thereby causing the danger of package cracking.

Moreover, at the time of die bonding, it is demanded that the adhesive layer properly follow the contour of adherend surface. In particular, for enhancing the follow property at the time of thermocompression bonding, it is demanded that the elastic modulus of the adhesive layer be low at the time of thermocompression bonding at high temperatures. However, the above conventional adhesives are unsatisfactory in this respect. Therefore, there is still a demand for improvement on pressure sensitive adhesives.

The present invention has been made in view of the above state of the prior art. It is an object of the present invention to provide an adhesive tape having an adhesive layer which enables reducing the water absorption of adhesive curing product and which enables lowering the elastic modulus thereof at thermocompression bonding.

SUMMARY OF THE INVENTION

The adhesive tape of the present invention comprises a base and, superimposed thereon, an adhesive layer, this adhesive layer comprising an adherent component (A), an epoxy resin (B), a thermally active latent epoxy resin curing agent (C), an energy radiation polymerizable compound (D) and a photopolymerization initiator (E), wherein either or both of the epoxy resin (B) and energy radiation polymerizable compound (D) have a dicyclopentadiene skeleton in its molecule or molecules thereof.

In the present invention, it is preferred that the epoxy resin (B) have a dicyclopentadiene skeleton and be represented by the formula:

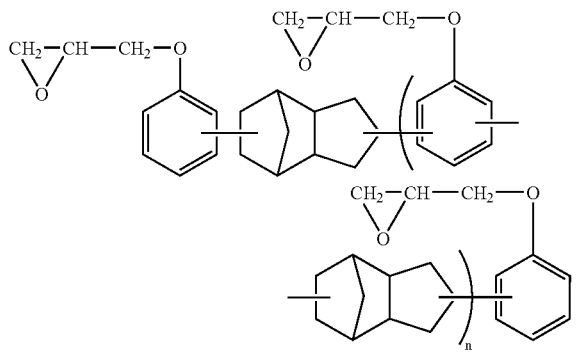

wherein n is an integer of 0 to 10.

It is also preferred that the energy radiation polymerizable compound (D) have a dicyclopentadiene skeleton and be represented by the formula:

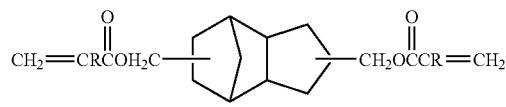

wherein R is a hydrogen atom or a methyl group.

By the present invention, there is provided an adhesive tape having an adhesive layer which enables reducing the water absorption of adhesive curing product to thereby avoid package cracking at the time of reflow and which enables lowering the elastic modulus thereof at thermocompression bonding to thereby ensure high capability of following the contour of adherend surface.

DETAILED DESCRIPTION OF THE INVENTION

As mentioned above, the adhesive tape of the present invention comprises a base and, superimposed thereon, an adhesive layer, this adhesive layer comprising an adherent component (A), an epoxy resin (B), a thermally active latent epoxy resin curing agent (C), an energy radiation polymerizable compound (D) and a photopolymerization initiator (E), wherein either or both of the epoxy resin (B) and energy radiation polymerizable compound (D) have a dicyclopentadiene skeleton in its molecule or molecules thereof.

First, each of the components constituting the adhesive layer will be described in detail below.

Although acrylic, polyester, urethane, silicone and natural rubber pressure sensitive adhesives and other various general-purpose pressure sensitive adhesives can be used as the adherent component (A), it is especially preferred in the present invention to employ acrylic pressure sensitive adhesives.

As the acrylic pressure sensitive adhesives, there can be mentioned, for example, a (meth)acrylic ester copolymer composed of structural units derived from a (meth)acrylic ester monomer and a (meth)acrylic acid derivative. As the (meth)acrylic ester monomer, use can be made of any of a (meth)acrylic acid cycloalkyl ester, benzyl (meth)acrylate and a (meth)acrylic acid alkyl ester having an alkyl group of 1 to 18 carbon atoms. Of these, it is especially preferred to use a (meth)acrylic acid alkyl ester having an alkyl group of 1 to 18 carbon atoms, such as methyl acrylate, methyl methacrylate, ethyl acrylate, ethyl methacrylate, propyl acrylate, propyl methacrylate, butyl acrylate or butyl methacrylate. As the (meth)acrylic acid derivative, there can be mentioned, for example, glycidyl (meth)acrylate having a glycidyl group or hydroxyethyl acrylate having a hydroxyl group.

The content of structural units derived from glycidyl (meth)acrylate in the (meth)acrylic ester copolymer is generally in the range of 0 to 80 mol %, preferably 5 to 50 mol %. Introduction of a glycidyl group in the (meth)acrylic ester copolymer enhances the compatibility of the (meth)acrylic ester copolymer with the epoxy resin (B), increases the Tg of curing product and realizes an improvement of thermal stability. Introduction of a hydroxylated monomer, such as hydroxyethyl acrylate, in the (meth)acrylic ester copolymer facilitates controlling of the adherence to adherends and pressure sensitive adhesive properties.

The molecular weight of acrylic pressure sensitive adhesives is preferably 100,000 or greater, still preferably in the range of 150,000 to 1,000,000. The glass transition temperature of acrylic pressure sensitive adhesives is generally 20° C. or below, preferably in the range of about −70 to 0° C. The acrylic pressure sensitive adhesives have stickiness at room temperature (23° C.).

Epoxy resins having a dicyclopentadiene skeleton, used as the epoxy resin (B), each have a dicyclopentadiene skeleton and a reactive epoxy group in the molecules thereof. The epoxy resins are generally solid at room temperature, and the softening temperature thereof is preferably in the range of about 40 to 90° C., still preferably 45 to 80° C., and optimally 50 to 70° C. The molecular weight of such epoxy resins having a dicyclopentadiene skeleton is preferably in the range of 430 to 3000, still preferably 700 to 2500, and optimally 1000 to 2000. The epoxy equivalent of epoxy resins having a dicyclopentadiene skeleton is preferably in the range of 150 to 1000 g/eq, still preferably 200 to 800 g/eq, and optimally 210 to 400 g/eq.

Among these epoxy resins (B) having a dicyclopentadiene skeleton, it is especially preferred to employ an epoxy resin of the formula:

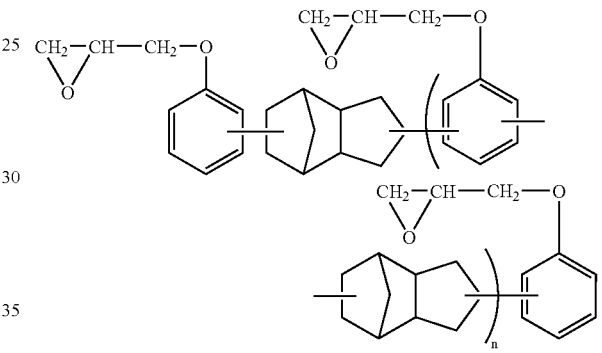

wherein n is an integer of 0 to 10. This n is preferably an integer of 0 to 7, still preferably 0 to 5.

Mixtures of epoxy resins whose n values are different from each other within the range of 0 to 10 are available as the epoxy resin having a dicyclopentadiene skeleton. For example, as such epoxy resin mixtures, there can be mentioned epoxy resins XD-1000-L and XD-1000-2L (tradenames, produced by Nippon Kayaku Co., Ltd.).

These epoxy resins having a dicyclopentadiene skeleton may be used individually or in combination.

When, as the epoxy resin (B), an epoxy resin having a dicyclopentadiene skeleton is used without combination with other general-purpose epoxy resins described later, the epoxy resin is preferably added in an amount of 5 to 1000 parts by weight, still preferably 50 to 800 parts by weight, and optimally 100 to 600 parts by weight, per 100 parts by weight of the above adherent component (A).

Further, as the epoxy resin (B), the epoxy resin having a dicyclopentadiene skeleton may be used in combination with other general-purpose epoxy resins. As the general-purpose epoxy resins, it is preferred to use an epoxy resin having a molecular weight of about 300 to 2000. It is especially preferred to use a blend of an ordinarily liquid epoxy resin of 300 to 500 molecular weight and an ordinarily solid epoxy resin of 400 to 2000 molecular weight. The epoxy equivalent of such general-purpose epoxy resins is generally in the range of 50 to 5000 g/eq. As such general-purpose epoxy resins, there can be mentioned, for example, glycidyl ethers of phenols such as bisphenol A, bisphenol F, resorcinol, phenylnovolak and cresol novolak; glycidyl ethers of alcohols such as butanediol, polyethylene glycol and polypropylene glycol; glycidyl ethers of carboxylic acids such as phthalic acid, isophthalic acid and tetrahydrophthalic acid; glycidyl or alkylglycidyl epoxy resins obtained by substituting an active hydrogen bonded to a nitrogen atom of aniline isocyanurate or the like with a glycidyl group; and so-called alicyclic epoxides obtained by, for example, oxidizing an intramolecular carbon to carbon double bond to thereby incorporate an epoxy group therein, such as vinylcyclohexane diepoxide, 3,4-epoxycyclohexylmethyl-3,4-dicyclohexanecarboxylate and 2-(3,4-epoxy)cyclohexyl-5,5-spiro(3,4-epoxy)cyclohexane-m-dioxane.

Of these, bisphenol glycidyl epoxy resins are preferably used as the general-purpose epoxy resins. These general-purpose epoxy resins can be used individually or in combination.

In the present invention, at least either of the energy radiation polymerizable compound (D) described later and the epoxy resin (B) must have a dicyclopentadiene skeleton in the molecule thereof.

When, as the epoxy resin (B), epoxy resin having a dicyclopentadiene skeleton is not used and other general-purpose epoxy resins (not having a dicyclopentadiene skeleton) are employed (when use is made of energy radiation polymerizable compound (D) having a dicyclopentadiene skeleton), the other general-purpose epoxy resins are preferably added in an amount of 5 to 1000 parts by weight, still preferably 50 to 800 parts by weight, and optimally 100 to 600 parts by weight, per 100 parts by weight of the above adherent component (A).

When the epoxy resin having a dicyclopentadiene skeleton is used in combination with other general-purpose epoxy resins, the sum of added epoxy resins (B) is preferably in the range of 5 to 1000 parts by weight, still preferably 50 to 800 parts by weight, and optimally 100 to 600 parts by weight, per 100 parts by weight of the above adherent component (A). In this combination, the proportion of epoxy resin having a dicyclopentadiene skeleton to other general-purpose epoxy resins is preferably in the range of 1:99 to 99:1, still preferably 5:95 to 50:50, and optimally 10:90 to 40:60.

The thermally active latent epoxy resin curing agent (C) is a curing agent of such a type that it does not react with the epoxy resin (B) at room temperature but, when heated to a certain temperature or above, is activated to thereby react with the epoxy resin (B).

The activation of the thermally active latent epoxy resin curing agent (C) can be accomplished by various methods, for example, the method wherein active species (anion and cation) are formed by chemical reaction induced by heating; the method wherein the thermally active latent epoxy resin curing agent (C) is stably dispersed in the epoxy resin (B) at about room temperature but, at high temperatures, is dissolved in the epoxy resin (B) to thereby initiate a curing reaction; the method wherein the curing agent is enclosed in a molecular sieve and is leached at high temperatures to thereby initiate a curing reaction; and the method wherein use is made of microcapsules.

The thermally active latent epoxy resin curing agents (C) can be used individually or in combination. In particular, dicyandiamide, imidazole compounds and mixtures thereof are preferably used as the thermally active latent epoxy resin curing agent (C).

The thermally active latent epoxy resin curing agent (C) is generally used in an amount of 0.1 to 20 parts by weight, preferably 0.5 to 15 parts by weight, and optimally 1 to 10 parts by weight, per 100 parts by weight of the sum of epoxy resin having a dicyclopentadiene skeleton and other general-purpose epoxy resins.

The energy radiation polymerizable compound having a dicyclopentadiene skeleton, used as the energy radiation polymerizable compound (D), has a dicyclopentadiene skeleton and one or more, preferably 2 to 10, energy radiation polymerizable groups in the molecule thereof. The molecular weight of the energy radiation polymerizable compound (D) is generally in the range of about 150 to 840, preferably 250 to 500.

As the energy radiation polymerizable compound having a dicyclopentadiene skeleton, preferred use is made of a polymerizable compound of the formula:

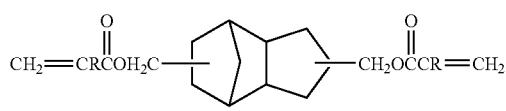

wherein R is a hydrogen atom or a methyl group, preferably a hydrogen atom.

As the energy radiation polymerizable compound (D) having a dicyclopentadiene skeleton, there can be mentioned, for example, R-684 (trade name, produced by Nippon Kayaku Co., Ltd.).

The energy radiation polymerizable compounds (D) each having a dicyclopentadiene skeleton maybe used individually or in combination.

When, as the energy radiation polymerizable compound (D), an energy radiation polymerizable compound having a dicyclopentadiene skeleton is used without the use of other general-purpose energy radiation polymerizable compounds described later, the energy radiation polymerizable compound (D) is preferably added in an amount of 0.1 to 500 parts by weight, still preferably 10 to 200 parts by weight, and optimally 20 to 100 parts by weight, per 100 parts by weight of the above adherent component (A).

Further, as the energy radiation polymerizable compound (D), the energy radiation polymerizable compound having a dicyclopentadiene skeleton may be used in combination with other general-purpose energy radiation polymerizable compounds. The general-purpose energy radiation polymerizable compounds each have at least one polymerizable double bond in the molecule thereof. The molecular weight thereof is generally in the range of about 100 to 30,000, preferably 300 to 10,000. For example, low-molecular-weight compounds as disclosed in Japanese Patent Laid-open Publication Nos. 60(1985)-196956 and 60(1985)-223139 are widely used as the above general-purpose energy radiation polymerizable compounds. Examples thereof include acrylate compounds, such as trimethylolpropane triacrylate, tetramethylolmethane tetraacrylate, pentaerythritol triacrylate, dipentaerythritol monohydroxypentaacrylate, dipentaerythritol hexaacrylate, 1,4-butylene glycol diacrylate, 1,6-hexanediol diacrylate and polyethylene glycol diacrylate.

Furthermore, use can be made of oligomer acrylate compounds having a functional group such as hydroxyl or carboxyl, for example, an oligoester acrylate, a urethane acrylate oligomer, an epoxy modified acrylate, a polyester acrylate, a polyether acrylate and an itaconic acid oligomer.

When, as the energy radiation polymerizable compound (D), energy radiation polymerizable compound having a dicyclopentadiene skeleton is not used and only other general-purpose energy radiation polymerizable compounds (not having a dicyclopentadiene skeleton) are employed (when use is made of epoxy resin (B) having a dicyclopentadiene skeleton), the other general-purpose energy radiation polymerizable compounds are preferably added in an amount of 0.1 to 500 parts by weight, still preferably 10 to 200 parts by weight, and optimally 20 to 100 parts by weight, per 100 parts by weight of the above adherent component (A).

When the energy radiation polymerizable compound having a dicyclopentadiene skeleton is used in combination with other general-purpose energy radiation polymerizable compounds, the sum of added energy radiation polymerizable compounds (D) is preferably in the range of 0.1 to 500 parts by weight, still preferably 10 to 200 parts by weight, and optimally 20 to 100 parts by weight, per 100 parts by weight of the above adherent component (A). In this combination, the proportion of energy radiation polymerizable compound having a dicyclopentadiene skeleton to other general-purpose energy radiation polymerizable compounds is preferably in the range of 1:99 to 99:1, still preferably 20:80 to 70:30, and optimally 40:60 to 50:50.

The adhesive comprising the above energy radiation polymerizable compound having a dicyclopentadiene skeleton and/or other general-purpose energy radiation polymerizable compounds is cured upon being irradiated with light. As the light, use is made of, for example, ultraviolet light.

Mixing of the photopolymerization initiator (E) into the above adhesive enables reducing not only the time of polymerization and curing but also the irradiation dose.

The photopolymerization initiator (E) can be selected from among, for example, benzophenone, acetophenone, benzoin, benzoin methyl ether, benzoin ethyl ether, benzoin isopropyl ether, benzoin isobutyl ether, benzoinbenzoic acid, methyl benzoinbenzoate, benzoindimethylketal, 2,4-diethylthioxanthone, hydroxycyclohexyl phenyl ketone, benzyl diphenyl sulfide, tetramethylthiuram monosulfide, azobisisobutyronitrile, benzil, dibenzyl, diacetyl and β-chloroanthraquinone.

The above photopolymerization initiator (E) is generally added in an amount of 0.5 to 15 parts by weight, preferably 1.0 to 10 parts by weight, and still preferably 1.5 to 6 parts by weight, per 100 parts by weight of the sum of energy radiation polymerizable compound having a dicyclopentadiene skeleton and other general-purpose energy radiation polymerizable compounds.

The adhesive layer of the adhesive tape of the present invention is composed of the above adherent component (A), epoxy resin (B), thermally active latent epoxy resin curing agent (C), energy radiation polymerizable compound (D) and photopolymerization initiator (E) as essential components.

The adhesive layer composed of the above components has the properties of being curable by energy radiation and also curable by heating. Thus, the adhesive tape can be used as an adhesive for wafer fixing at the time of dicing and can be used as an adhesive for thermocompression bonding of chips to lead frames at the time of mounting. Although this thermocompression bonding is generally performed by heating at 80 to 150° C., the adhesive layer of the present invention exhibits a low elastic modulus at this temperature range with the result that the adhesive tape can properly follow the contour of adherend surface to thereby enable attaining a secure bonding of chips to lead frames.

Finally, a curing product of high impact resistance can be provided by thermal curing. Further, the curing product has an excellent balance of shear strength and peel strength, and can retain satisfactory bonding properties even if exposed to severe thermal and humid conditions. Still further, the water absorption of the curing product of adhesive layer is so low that the occurrence of package cracking at the reflow step can be reduced.

For the purpose of imparting electrically conductive properties after die bonding, the pressure sensitive adhesive layer may be loaded with an electrically conductive filler such as gold, silver, copper, nickel, aluminum, stainless steel, carbon, ceramic or a material obtained by coating nickel, aluminum or the like with silver. Further, for imparting thermally conductive properties, the pressure sensitive adhesive layer may be loaded with a thermally conductive filler such as gold, silver, copper, nickel, aluminum, stainless steel, silicon, germanium or other metallic material or an alloy thereof. These additives may be added in an amount of about 10 to 400 parts by weight per 100 parts by weight of the adhesive component (namely, components A+B+C+D+E).

This adhesive layer can be loaded with an organic polyisocyanate compound, an organic polyimine compound and the like in order to regulate the initial adhesive strength and cohesive strength thereof before exposure to energy radiation.

The organic polyisocyanate compound can be, for example, selected from among aromatic polyisocyanate compounds, aliphatic polyisocyanate compounds, alicyclic polyisocyanate compounds, trimers of these polyisocyanate compounds and isocyanate-terminated urethane prepolymers obtained by reacting these polyisocyanate compounds with polyol compounds. Specific examples of the organic polyisocyanate compounds include 2,4-tolylene diisocyanate, 2,6-tolylene diisocyanate, 1,3-xylylene diisocyanate, 1,4-xylylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate and lysine isocyanate.

Specific examples of the above organic polyimine compounds include
N,N'-diphenylmethane-4,4'-bis(1-aziridinecarboxyamide),
trimethylolpropane-tri-β-aziridinyl propionate,
tetramethylolmethane-tri-β-aziridinyl propionate and
N,N'-toluene-2,4-bis(1-aziridinecarboxyamido)triethylenemelamine.

It is generally preferred that these organic polyisocyanate compounds or organic polyimine compounds be added in an amount of 0 to 10 parts by weight, especially 0.1 to 5 parts by weight, and still especially 0.5 to 2 parts by weight, per 100 parts by weight of the adherent component (A).

Furthermore, an antistatic agent can be added to the above adhesive layer. The addition of the antistatic agent can suppress the generation of static electricity at the expanding or pickup step, so that the chip reliability is enhanced. Examples of suitable antistatic agents include generally known activators such as anionic, cationic, nonionic and amphoteric activators. It is preferred that the antistatic agent be used in an amount ranging from 0 to 50% by weight, especially from 0 to 30% by weight, based on the weight of the adhesive layer.

For example, when ultraviolet light is employed as the energy radiation, a transparent film is used as the base of the adhesive tape of the present invention. Examples of suitable transparent films include a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene/vinyl acetate film, an ionomer resin film, an ethylene/(meth)acrylic acid copolymer film, an ethylene/(meth)acrylic acid ester copolymer film, a polystyrene film and a polycarbonate film. Further, use is made of crosslinked films therefrom. Still further, laminate films therefrom may be used. On the other hand, when electron beams are employed as the energy radiation, it is not requisite for the base to be transparent. Therefore, use can be made of not only the above transparent films but also opaque films obtained by coloring them, fluororesin films and the like.

The surface tension of the base is preferably 40 dyne/cm or less, still preferably 37 dyne/cm or less, and optimally 35 dyne/cm or less. This enables easily transferring of the adhesive layer of the adhesive tape of the present invention to silicon chips at the time of die bonding. The above base with low surface tension can be obtained by selecting an appropriate material. Also, it can be obtained by subjecting the surface of the base to release treatment such as application of a silicone resin or the like.

The thickness of the base is generally in the range of about 10 to 300 µm, preferably 20 to 200 µm, and still preferably 50 to 150 µm.

The adhesive tape of the present invention can be obtained by coating the base with the adhesive composition composed of the above components by customary means such as a roll knife coater, a gravure coater, a die coater or a reverse coater, and drying the coating layer to thereby form an adhesive layer. According to necessity, the adhesive composition can be dissolved or dispersed in a solvent before the coating operation.

It is generally preferred that the thickness of the thus formed adhesive layer be in the range of 3 to 100 µm, especially 10 to 60 µm. The thus obtained adhesive tape is utilized in the following manner.

The adhesive tape of the present invention is stuck to one major surface of a silicon wafer, and the silicon wafer is fixed through the adhesive tape onto a dicing unit. The silicon wafer with the adhesive tape is cut into IC chips by the use of cutting means such as a dicing saw.

The resultant adhesive tape stuck to IC chips is exposed to energy radiation. As the energy radiation which can be employed in the present invention, there can be mentioned, for example, ultraviolet light (central wavelength=about 365 nm) or electron beams. When ultraviolet light is used as the energy radiation, generally, the irradiation intensity is set so as to fall within the range of 20 to 500 mW/cm$^2$ while the irradiation time is set so as to fall within the range of 0.1 to 150 sec. Further, for example, in the irradiation with electron beams as well, conditions can be set with reference to those employed in the above irradiation with ultraviolet light. In addition, at the time of exposure to energy radiation, auxiliary heating can be effected.

This exposure to energy radiation enables detaching from the base the adhesive layer held stuck to one major surface of IC chips. The exposure to energy radiation may be performed prior to the dicing operation.

The obtained IC chips having the adhesive layer stuck thereto are mounted on lead frames, and heated so that the epoxy resin (B) of the adhesive layer is cured. Thus, the IC chips and lead frames are bonded to each other. The heating temperature is generally in the range of about 80 to 300° C., preferably about 80 to 250° C., and still preferably about 80 to 170° C. The heating time is generally in the range of 1 to 120 min, preferably 5 to 60 min. As a result of this heating, the thermally curable adhesive component is cured to thereby attain strong bonding of the IC chips and lead frames to each other. Moreover, the adhesive layer composed of the above specified components exhibits a low elastic modulus at the time of thermocompression bonding, so that the adhesive layer properly follows the contour of adherend surface with the result that the adherend and IC chips can be bonded to each other with satisfactory strength. In this connection, the elastic modulus (at 150° C.) of the adhesive layer exhibited after the curing of the energy radiation polymerizable compound (D) contained in the adhesive layer is preferably in the range of $1.0 \times 10^1$ to $8.0 \times 10^3$ Pa, still preferably $3.0 \times 10^1$ to $5.0 \times 10^3$ Pa, and optimally $1.0 \times 10^2$ to $1.0 \times 10^3$ Pa.

Furthermore, the final curing product after the curing of the epoxy resin (B) exhibits an extremely low water absorption coefficient, so that, even if exposed to high temperatures at the time of reflow, the final curing product is free from water evaporation to thereby enable reducing the occurrence of package cracking. Accordingly, the water absorption coefficient (measured after exposure to 85% RH atmosphere at 85° C. for 168 hr) of the finally cured adhesive layer is preferably 2.3% or below, still preferably 2.0% or below, and optimally 1.9% or below.

Apart from the above usage, the adhesive tape of the present invention can be used in the bonding of semiconductor compounds, glass, ceramics, metals, etc.

By virtue of the present invention described above, there is provided an adhesive tape furnished with an adhesive layer which finally forms an adhesive curing product of low water absorption to thereby enable preventing package cracking at the time of reflow, and which realizes lowering of the elastic modulus at thermocompression bonding, thereby being excellent in the capability of following the contour of adherend surface.

EXAMPLE

The present invention will further be illustrated below with reference to the following Examples which in no way limit the scope of the invention.

In the following Examples and Comparative Example, the "waterabsorptioncoefficient", "elasticmodulus" and "peel strength" were measured in the following manners.

"Water Absorption Coefficient"

Adhesive tape pieces were piled one upon another into a laminate of 1.0±0.2 mm thickness, and cut into a size of 50 mm×50 mm. Both major surfaces of the laminate were irradiated with ultraviolet light and heated at 160° C. for 1 hr to thereby effect thermal curing. The thus obtained sample was allowed to stand still in an atmosphere of 85% relative humidity at 85° C. for 168 hr. The water absorption coefficient was calculated from any weight increase of the sample.

"Elastic Modulus"

With respect to each of the adhesives of the Examples and Comparative Example, one not containing any thermally active latent epoxy resin curing agent (C) was prepared. Both major surfaces of a sample thereof were irradiated with 200 mJ/cm$^2$ ultraviolet light. With respect to the resultant sample, the elastic modulus at 150° C. according to the torsion shear method was measured by the use of RDA II manufactured by Rheometric Scientific F. E. Ltd. at 1 Hz.

"Peel Strength"

Each of the adhesive tapes was stuck to #2000 polished surface of a 350 µm thick silicon wafer, irradiated with ultraviolet light of 230 mJ/cm$^2$ light quantity, and diced into a size of 10 mm×10 mm. Thereafter, each silicon chip with adhesive obtained by detaching the base from the adhesive layer was compression bonded to a 150 μm thick copper sheet of 10 mm×50 mm at 150° C. for 1 sec, and allowed to stand still in a thermostat chamber at 160° C. for 1 hr to thereby effect thermal curing of the adhesive layer. Thus, a sample for measuring peel strength was obtained.

The silicon chip side of the sample was fixed by bonding, and the copper sheet was peeled at an angle of 90° to thereby effect measuring of the peel strength (mN/10 mm). The peeling speed was 50 mm/min.

In the Examples and Comparative Example described below, the following materials were used as the adherent component (A), epoxy resin (B), thermally active latent epoxy resin curing agent (C), energy radiation polymerizable compound (D) and photopolymerization initiator (E).

(A) Adherent Component copolymer of 900,000 weight average molecular weight and −28° C. glass transition temperature, obtained by copolymerizing 55 parts by weight of butyl acrylate, 10 parts by weight of methyl methacrylate, 20 parts by weight of glycidyl methacrylate and 15 parts by weight of 2-hydroxyethyl acrylate.

(B) Epoxy Resin (B1): liquid bisphenol A epoxy resin (epoxy equivalent: 180 to 200, softening point: nil, molecular weight: about 420)

(B2): solid bisphenol A epoxy resin (epoxy equivalent: 800 to 900, softening point: 93° C., molecular weight: about 1700)

(B3) epoxy resin having a dicyclopentadiene skeleton (trade name XD-1000-L produced by Nippon Kayaku Co., Ltd., epoxy equivalent: 240 to 250, softening point: 66° C., n=0.6 to 0.7)

(B4) epoxy resin having a dicyclopentadiene skeleton (trade name XD-1000-2L produced by Nippon Kayaku Co., Ltd., epoxy equivalent: 240 to 250, softening point: 57° C., n=0.3 to 0.4)

(B5): solid o-cresol novolak epoxy resin (epoxy equivalent: 210 to 230, softening point: 92° C., molecular weight: about 1650).

(C) Thermally Active Latent Epoxy Resin Curing Agent (Epoxy Hardener)

(C1): dicyandiamide (trade name: Hardener 3636AS, produced by Asahi Denka Kogyo K.K.)

(C2): 2-phenyl-4,5-dihydroxymethylimidazole (trade name: Curezol 2PHZ, produced by Shikoku Chemicals Corporation)

(D) Energy Radiation Polymerizable Compound (D1): energy radiation polymerizable compound having a dicyclopentadiene skeleton (trade name: Kayarad R684, produced by Nippon Kayaku Co., Ltd., molecular weight: 304)

(D2): dipentaerythritol hexaacrylate (molecular weight: 578).

(E) Photopolymerization Initiator 1-hydroxycyclohexyl phenyl ketone.

(F) Other crosslinking agent: aromatic polyisocyanate (trimethylolpropane adduct of toluylene diisocyanate).

Example 1

An adhesive composition was obtained by mixing the components together in the proportions as specified in Table 1. A base of a 90 μm thick laminate film composed of a plasticized PVC layer and a layer of ethylene/methacrylic acid copolymer on its side of ethylene/methacrylic acid copolymer layer (surface tension: 35 dyn/cm) was coated with this adhesive composition so that a 20 μm adhesive layer was formed on the base. Thus, an adhesive tape was obtained.

The "water absorption coefficient", "elastic modulus" and "peel strength" of the obtained adhesive tape were measured in the above manners. The results are listed in Table 1.

Examples 2 to 4 and Comparative Example 1

The same operations as in Example 1 were repeated except that the proportions of added components were changed as specified in Table 1. The results are listed in Table 1.

TABLE 1

| | Compsn. of adhesive layer (pts. wt.) | | | | | | | | | | | | | |
|---|---|---|---|---|---|---|---|---|---|---|---|---|---|---|
| | adherent compo- | epoxy resin | | | | | epoxy curing agent | | energy radiation polymerizable compd. | | photopolymn. initiator (E) | crosslinking agent (F) | Water absorption coefficient (%) | Elastic modulus (150° C.) (Pa) | Peel strength (mN/10 mm) |
| | nent A | B1 | B2 | B3 | B4 | B5 | C1 | C2 | D1 | D2 | | | | | |
| Example 1 | 20 | 20 | 40 | 20 | | | 1 | 1 | 10 | | 0.3 | 0.3 | 1.89 | $5.21 \times 10^2$ | 7000 |
| Example 2 | 20 | 20 | 40 | | 20 | | 1 | 1 | 10 | | 0.3 | 0.3 | 1.87 | $3.14 \times 10^2$ | 6500 |
| Example 3 | 20 | 20 | 40 | 20 | | | 1 | 1 | | 10 | 0.3 | 0.3 | 2.09 | $6.03 \times 10^2$ | 7800 |
| Example 4 | 20 | 20 | 40 | | | 20 | 1 | 1 | 10 | | 0.3 | 0.3 | 2.24 | $1.10 \times 10^3$ | 7500 |
| Comp. Ex. 1 | 20 | 20 | 40 | | | 20 | 1 | 1 | | 10 | 0.3 | 0.3 | 2.59 | $8.85 \times 10^3$ | 8000 |

The invention claimed is:

1. An adhesive tape comprising a base and, superimposed thereon, an adhesive layer, said adhesive layer comprising an adherent component (A), an epoxy resin (B), a thermally active latent epoxy resin curing agent (C), an energy radiation polymerizable compound (D) and a photopolymerization initiator (E), wherein the epoxy resin (B) has a dicyclopentadiene skeleton and is represented by the formula:

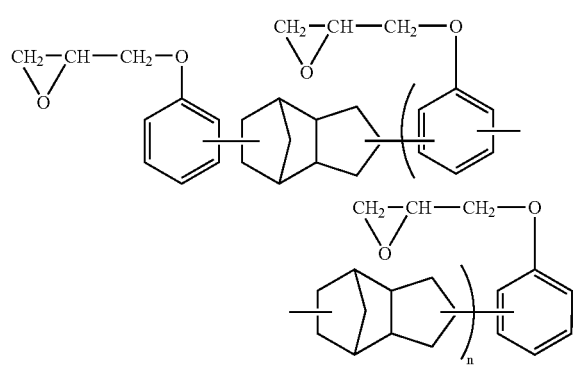
wherein n is an integer of 0 to 10.
2. The adhesive tape as claimed in claim 1, wherein the energy radiation polymerizable compound (D) has a dicyclopentadiene skeleton and is represented by the formula:
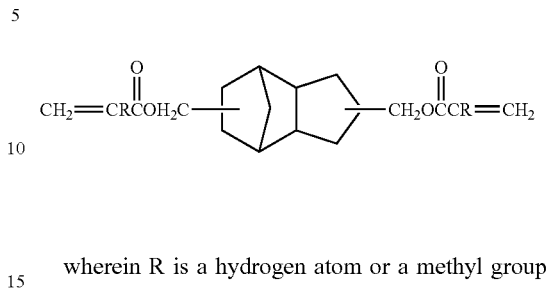
wherein R is a hydrogen atom or a methyl group.
* * * * *